(12) United States Patent
Nakahara et al.

(10) Patent No.: US 6,826,109 B2
(45) Date of Patent: Nov. 30, 2004

(54) SEMICONDUCTOR INTEGRATED CIRCUIT DEVICE WITH A RAM MACRO HAVING TWO OPERATION MODES FOR RECEIVING AN INPUT SIGNAL AT DIFFERENT TIMINGS

(75) Inventors: Shigeru Nakahara, Musashimurayama (JP); Satoshi Iwahashi, Ome (JP); Takeshi Suzuki, Tachikawa (JP); Keiichi Higeta, Hamura (JP); Kazuo Kanetani, Akishima (JP)

(73) Assignee: Hitachi, Ltd., Tokyo (JP)

( * ) Notice: Subject to any disclaimer, the term of this patent is extended or adjusted under 35 U.S.C. 154(b) by 13 days.

(21) Appl. No.: 10/345,186

(22) Filed: Jan. 16, 2003

(65) Prior Publication Data

US 2003/0142526 A1 Jul. 31, 2003

(30) Foreign Application Priority Data

Jan. 29, 2002 (JP) ........................................ 2002-020721

(51) Int. Cl.$^7$ ................................................. G11C 7/00
(52) U.S. Cl. ........................................ 365/229; 365/233
(58) Field of Search .................................. 365/229, 233

(56) References Cited

U.S. PATENT DOCUMENTS 5,422,858 A * 6/1995 Mizukami et al. .......... 365/233
5,566,108 A    10/1996 Kitamura .................... 365/233
6,243,320 B1 *  6/2001 Hamamoto et al. ..... 365/230.08
6,266,294 B1 *  7/2001 Yada et al. ................. 365/233
6,292,412 B1    9/2001 Kato et al. .................. 365/194

FOREIGN PATENT DOCUMENTS

| JP | 8-102188   | 9/1994 |
| JP | 8-329680   | 5/1995 |
| JP | 2000-21165 | 6/1998 |
| JP | 2001-14847 | 6/1999 |

* cited by examiner

*Primary Examiner*—M. Tran
(74) *Attorney, Agent, or Firm*—Reed Smith LLP; Stanley P. Fisher, Esq.; Juan Carlos A. Marquez, Esq.

(57) ABSTRACT

The invention provides a semiconductor integrated circuit device on which a RAM macro capable of selecting an operation mode adapted to improved ease of use, response, or low power consumption or selecting an input setup value is mounted. In a first operation mode of a RAM macro, a timing of receiving an input signal is set as a first timing. In a second operation mode, a timing of receiving an input signal is set to a second timing later than the first timing. In a semiconductor integrated circuit device including an input circuit for receiving an input signal and a decoder circuit for decoding an output signal of the input circuit, the input circuit is activated on the basis of a first signal and the decoder circuit is activated on the basis of a second signal.

14 Claims, 12 Drawing Sheets

SEMICONDUCTOR INTEGRATED CIRCUIT DEVICE WITH A RAM MACRO HAVING TWO OPERATION MODES FOR RECEIVING AN INPUT SIGNAL AT DIFFERENT TIMINGS

BACKGROUND OF THE INVENTION

The present invention relates to a semiconductor integrated circuit device and a technique effectively applied to a large scale integrated circuit having, for example, a RAM macro.

By investigation of known techniques after achieving the present invention, the following report has been made on a technique regarding a memory circuit having two operation modes associated with high response and low power consumption as one of features of the present invention. Japanese Patent Application No. 2000–21165 (corresponding to U.S. Pat. No. 6,266,294) and Japanese Patent Application No. 2001–14847 (corresponding to U.S. Pat. No. 6,292,412) disclose a synchronous memory having an active power-down mode in which a DLL circuit for generating a sync clock is set in an operative state and response is increased and a standby power-down mode in which the operation of the DLL circuit is also stopped to realize low power consumption.

SUMMARY OF THE INVENTION

In each of the techniques, a sync clock generating circuit is provided internally and the application range is limited to the circuit. The inventor herein came up with an idea of providing two modes of a mode assigning a priority on response and a mode assigning a priority on low power consumption by providing two or more signals for activating a memory circuit, such as a clock enable signal and a chip select signal and setting a role to each of the signals. From another viewpoint, the two modes can be used for setting two kinds of setup values of write data.

An object of the invention is to provide a semiconductor integrated circuit device on which a RAM macro or the like with improved ease of use is mounted. Another object of the invention is to provide a semiconductor integrated circuit device on which a RAM macro of which operation mode adapted to either response or low power consumption can be selected. Further another object of the invention is to provide a semiconductor integrated circuit device on which a RAM macro capable of selecting an input setup value can be selected is mounted. The above and other objects and novel features of the present invention will become apparent from the description of the specification and accompanying drawings.

The outline of a representative one of inventions disclosed in the specification will be briefly described as follows. In a first operation mode of a RAM macro, a timing of receiving an input signal is set as a first timing. In a second operation mode, a timing of receiving an input signal is set to a second timing later than the first timing.

The outline of another representative one of inventions disclosed in the specification will be briefly described as follows. In a semiconductor integrated circuit device including an input circuit for receiving an input signal and a decoder circuit for decoding an output signal of the input circuit, the input circuit is activated on the basis of a first signal and the decoder circuit is activated on the basis of a second signal.

DETAILED DESCRIPTION OF THE PREFERRED EMBODIMENTS

Figure 1:
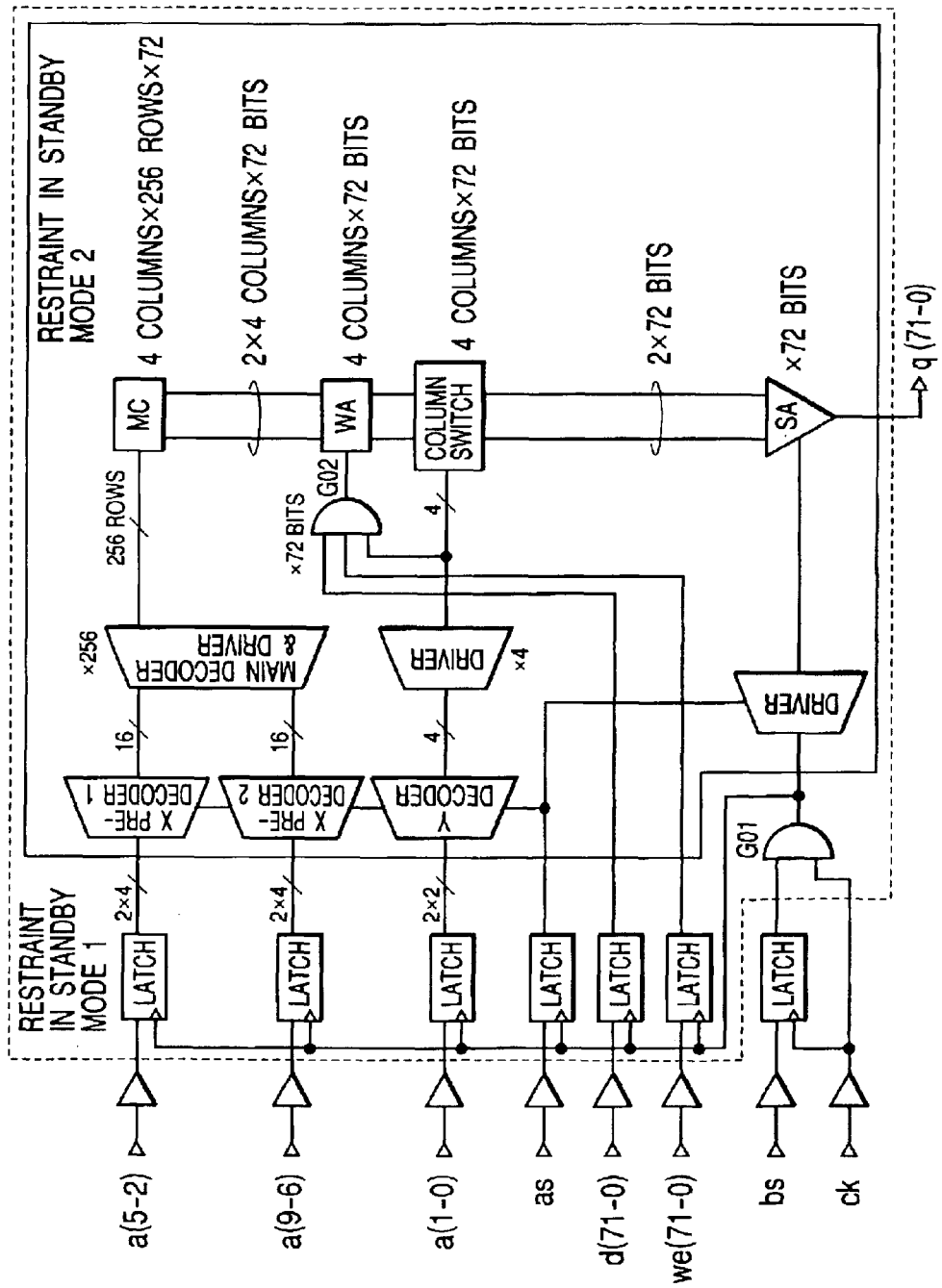
FIG. 1 is a block diagram showing an example of a RAM macro mounted on a semiconductor integrated circuit device according to the invention.

FIG. 1 is a block diagram showing an example of a RAM macro mounted on a semiconductor integrated circuit device according to the invention. Although not limited, the RAM macro of the example is directed to a static RAM having a relatively small storage capacity. For example, a memory cell array has a storage capacity of about 72 KB (=four columns (bit line pairs)×256 rows (word lines)×72 bits).

Since the memory cell array has 256 word lines as described above, a row selection circuit is provided as follows for selecting one of the 256 word lines. Four bits of an address signal a(5-2) and four bits of an address signal a(9-6) are transmitted to address input circuits and latch circuits. Output signals of the latch circuits are input to an X predecoder 1 and an X predecoder 2, a $\frac{1}{16}$ decode signal is generated from each of the two X predecoders 1 and 2 and transmitted to a main decoder and driver by which a $\frac{1}{256}$ selection signal for selecting one of 256 word lines is generated.

In a column selection circuit, in order to select one of the four pairs of bit lines, two bits of an address signal a(1-0) is used. The address signal a(1-0) is transmitted to an address input circuit and a latch circuit. An output signal of the latch circuit is transmitted to a Y decoder where a $\frac{1}{4}$ decode signal is generated, and the generated decode signal is transmitted to a column switch via a driver.

In the embodiment, a write amplifier WA(4×72) is provided for each bit line. For the write amplifier, an AND signal of the column selection signal, a write control signal we(71-0) and write data d(71-0) are transmitted to a gate circuit G02. Specifically, the write data d(71-0) is transmitted to an amplifier designated by the write control signal we(71-0) out of 72 write amplifiers WA(71-0) selected as $\frac{1}{4}$ by the column selection signal. The write control signal we(71-0) is used as a signal for setting a mask on the write data d(71-0) on a bit unit basis. On the other hand, a read signal of the bit line selected via a column switch is amplified by a sense amplifier SA and read signals q(71-0) of 72 bits are output in parallel.

In the embodiment, although not particularly limited, a clock synchronous type of performing an internal operation synchronously with a clock signal ck is employed. Input of the clock signal ck is controlled by a first signal (block select) bs as a clock enable signal. To be specific, the first signal bs is supplied to a latch circuit synchronously with the clock signal ck and the first signal bs supplied to the input of the latch circuit is latched. The AND gate circuit G01 is controlled by an output signal of the latch circuit to permit input of the clock signal ck and to transmit the clock signal ck to the latch circuit and the sense amplifier which receive the address signal a(9-0), write control signal we(71-0), write data d(71-0), and a second signal (array select) "as" newly provided in the invention. By the clock signal permitted to be input, the operation of the latch circuits is made valid.

In the embodiment, the input circuit and the latch circuit are shown in different circuit blocks. However, as will be described later, the latch circuit and the input circuit are constructed by a single circuit. Consequently, by the clock signal supplied via the gate circuit, an input circuit for receiving input signals other than the signals bs and ck is activated. The sense amplifiers SA are provided as many as 72, so that a driver for transmitting the clock signal to the sense amplifiers is provided.

The second signal is, although not particularly limited, used as a signal for activating the driver for transmitting the clock signal as an activate signal to the X decoders 1 and 2, a Y decoder, and the sense amplifiers SA. With the configuration, the RAM macro of the embodiment has two kinds of standby modes of a first standby mode of setting the first signal bs to an inactive level and a second standby mode of making the first signal active and setting the second signal as to an inactive level.

In the first standby mode, the first signal bs is inactive. At this time, only the input circuit for receiving the clock signal ck and the input circuit and the latch circuit for receiving the first signal bs are operative, and all of the other circuits are inactive. Consequently, about 99% of power consumption in the memory operating mode can be reduced. In other words, in the standby mode 1, only the input circuit and the latch circuit for receiving the first signal bs are operative, so that current consumption is only about 1% of current consumption in a state where the whole memory circuit is operating, so that the low power consumption mode is achieved.

In the second standby mode, the first signal bs is active. Consequently, the input circuit and the latch circuit corresponding to the address signal, write control signal, write data, and second signal become operative, and internal circuits such as the X predecoders 1 and 2, the driver, and the like are made inactive by the second signal "as" so that 90% of the current consumption in the memory operating state can be reduced. That is, in the standby mode 2, current of about 10% of that in the operation mode is generated by the input circuit. On the contrary, since the input circuit is operative, response in the RAM macro activated by the second signal can be increased.

By activation of the RAM macro by the first signal bs and activation of the RAM macro by the second signal "as", two kinds of operation modes regarding the response and power consumption can be set as described above. In addition, as will be described above, by an access in the standby mode 1 by the signal bs and an access in the standby mode 2 by the signal "as", two kinds of setup values of input signals can be set.

Figure 2:
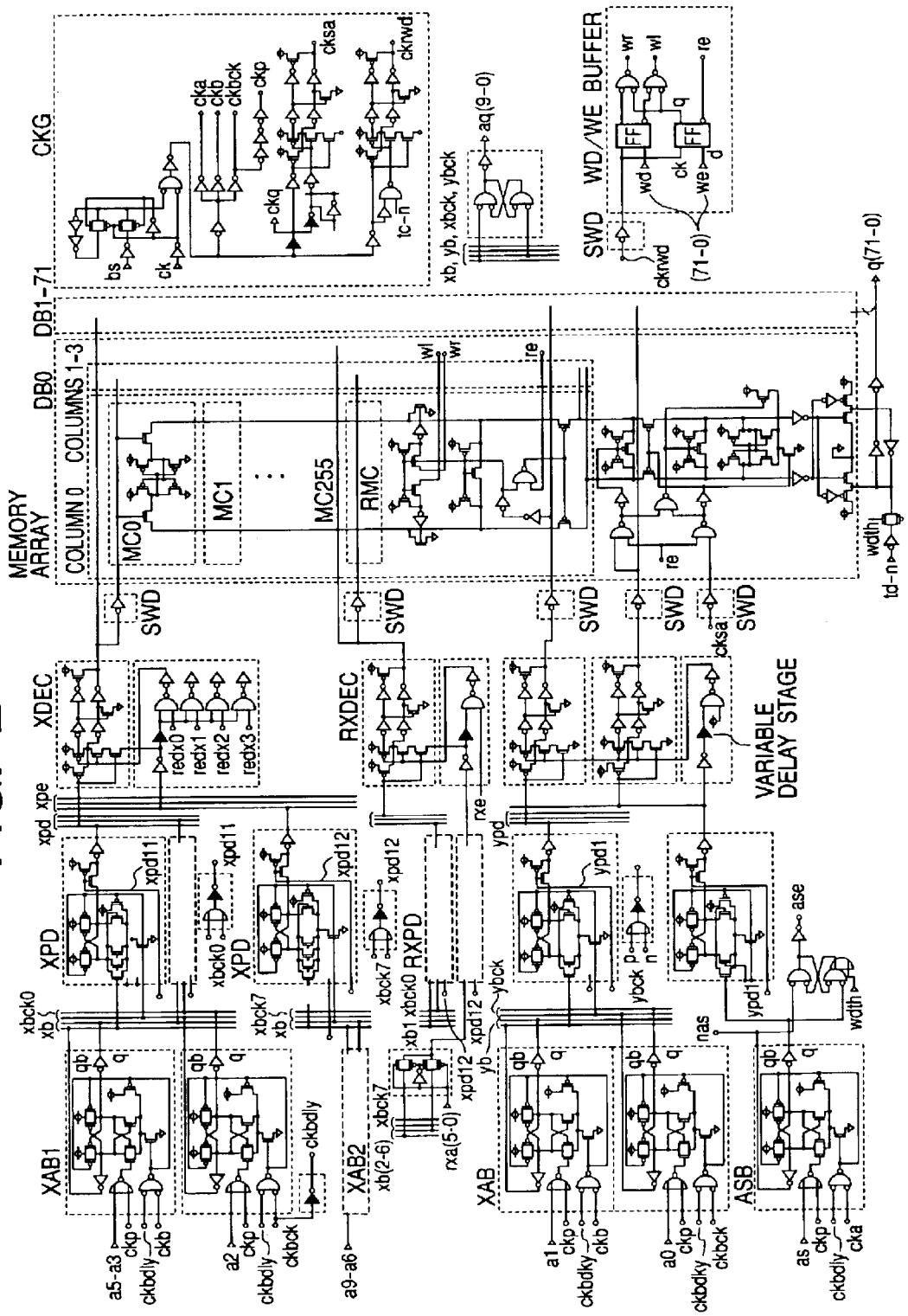
FIG. 2 is a concrete circuit diagram showing an example of the RAM macro of FIG. 1.

FIG. 2 is a concrete circuit diagram of an example of the RAM macro. A memory array is constructed by data blocks DB0 to DB71. Each of the data blocks DB0 to DB71 has, as illustrated in the data block DB0 as an example, columns 0 to 3. A pair of bit lines corresponding to the column 0 is provided with 256 memory cells MC0 to MC255. Each of the memory cells MC0 to MC255 is connected to a subword line. RMC denotes a memory cell for redundancy. When any of the subword lines or the memory cells connected to the subword lines becomes faulty, the defective one is replaced with the memory cell RMC for redundancy.

The subword line is driven by a subword driver SWD. Although not particularly limited, the subword driver SWD is provided in correspondence with each of the data blocks DB0 to DB71, receives a signal for selecting a main word line driven by a main decoder XDEC, and selects a corresponding subword line.

A clock buffer CKG receives the first signal bs synchronously with the clock signal ck, the gate circuit is controlled by an output of the latch circuit to permit inputting of the clock signal ck, and internal clock signals cka, ckb, ckbck, ckp, and the like are generated. By the internal clock signals cka, ckb, ckbck, and ckp, operations of the input circuits and latch circuits XAB1, XAB2, YAB, and ASB for receiving the address signals a5 to a2, a9 to a6, a1, and a0, and the first signal "as" are controlled.

Write data wd and the write control signal "we" are input from a WD/WE buffer. Each of the signals wd and "we" is input to a latch circuit FF and the operation is controlled by a clock signal ckrwd received from the clock buffer CKG.

A concrete configuration of each of the input circuit, the latch circuit, and the memory array will be described later. A predecoder XPD is constructed by a circuit similar to the input circuit and generates, for example, 16 pairs of predecode signals xpd by combining six pairs of complementary address signals xb and a pair of complementary address signals xbck0 corresponding to the address signal a2 by using three bits of the address signals a5 to a3.

The complementary address signals a5 to a3 are supplied to the gates of input MOSFETs connected in parallel for performing predecoding operation in eight ways. Two sets of the same circuits are provided. The complementary address signals are supplied to the circuits. One of the pair of complementary address signals xbck0 is supplied to one of the sets and the other complementary address signal xbck0 is supplied to the other set. By making the logic operation of each of the sets valid, the 16 predecode signals are generated. As for the address signals a9 to a6 as well, similar circuits are provided and the 16 predecode signals are generated.

The main decoder XDEC generates 256 word line selection signals by combining the 16 predecode signals xpd and xpe. Redundancy predecoders RPXD and RXDEC generate signals for selecting the redundancy memory cell RMC when a defect address is accessed.

Figure 3:
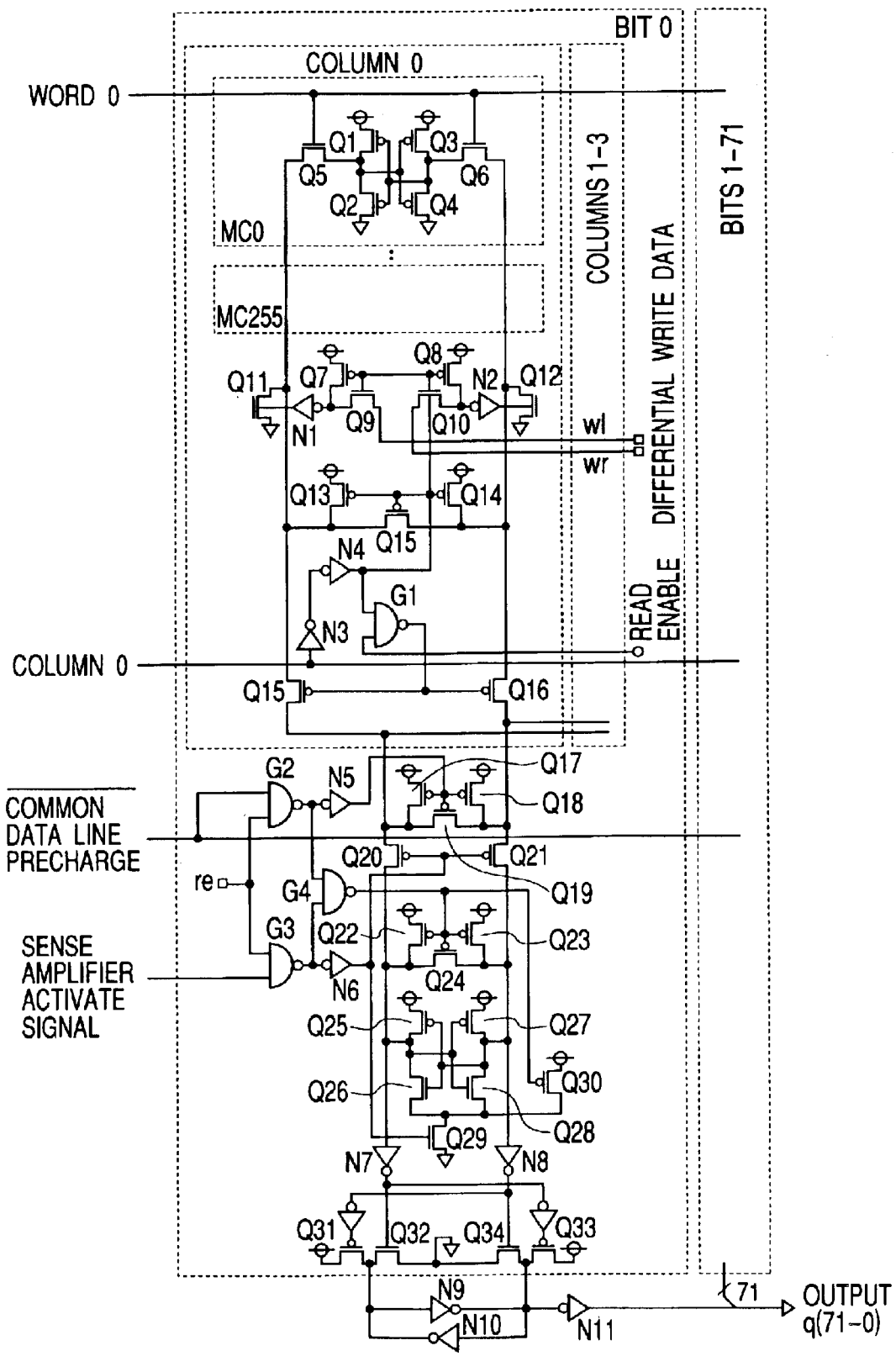
FIG. 3 is a concrete circuit diagram showing an example of a memory array in the RAM macro of FIG. 1.

FIG. 3 is a concrete circuit diagram of an example of the memory array in the RAM macro. A memory cell MC is constructed by a latch circuit in which input terminals and output terminals of two CMOS inverter circuits formed by P-channel MOSFETs Q1 and Q3 and N-channel MOSFETs Q2 and Q4 are cross coupled, and N-channel MOSFETs Q5 and Q6 for address selection provided between the pair of input/output nodes and a pair of complementary bit lines. The gates of the MOSFETs Q5 and Q6 are connected to a word line.

To the complementary bit lines, a write amplifier constructed by MOSFETs Q11 and Q12, and inverter circuits N1 and N2, P-channel MOSFETs Q7 and Q9, and N-channel MOSFETs Q9 and Q10 for driving the MOSFETs Q11 and Q12 is provided. To the MOSFETs Q9 and Q10, write data wl and wr is transmitted, respectively. MOSFETs Q13, Q14 and Q15 form a bit precharge (equalize) circuit to which a column selection signal is transmitted via inverter circuits N3 and N4. The signal is also used as a signal for selecting the write amplifier.

A gate circuit G1 is controlled by a read enable signal and transmits-the column selection signal to column switch MOSFETs Q15 and Q16. The column switch MOSFETs Q15 and Q16 are of the P channel and connect the complementary bit lines to a common data line. Four pairs of complementary bit lines are provided for a pair of common data lines and any one of the complementary bit lines is connected to the common data line by the column selection signal.

The common data line is provided with a common data line precharge circuit constructed by MOSFETs Q17 to Q19. Between the common data and the input of the sense amplifier, P-channel MOSFETs Q20 and Q21 for reducing capacity are provided. Also in the input part of the sense amplifier, a precharge circuit constructed by MOSFETs Q22 to Q24 is provided.

The sense amplifier is constructed by a latch circuit in which input terminals and output terminals of CMOS inverter circuits formed by P-channel MOSFETs Q25 and Q27 and N-channel MOSFETs Q26 and Q28 are cross coupled, and an N-channel MOSFET Q29 for supplying a ground potential of the circuit as an operation voltage to the latch circuit. To the gates of the P-channel MOSFETs Q20 and Q21 for reducing capacity in the input part and the N-channel MOSFET Q29, a sense amplifier activate signal is supplied via an inverter circuit N6.

The precharging operation is finished by a common data line precharge signal and a read signal of a complementary bit line selected by the column selection signal is transmitted to the common data line. The signal is transmitted to the input part of the sense amplifier via the P-channel MOSFETs Q20 and Q21 for reducing capacity. When the sense amplifier activate signal is made active, the P-channel MOSFETs Q20 and Q21 for reducing capacity are turned off and the input part of the sense amplifier and the common data line are disconnected from each other. Consequently, by the on state of the N-channel MOSFET Q29, a high level/low level amplification signal is generated at high speed by a forward feedback operation of the CMOS inverter circuits in the latch circuit and is latched.

An output signal of the latch circuit as a component of the sense amplifier is transmitted via the inverter circuit to a tri-state output circuit constructed by P-channel MOSFETs Q31 and Q33 and N-channel MOSFETs Q32 and Q34. In the output circuit, when the output signal of the sense amplifier is in a high-level precharging state, both the P-channel MOSFETs Q31 and Q33 and the N-channel MOSFETs Q32 and Q34 are turned off and an output high impedance state is resulted. The output part includes a latch circuit constructed by CMOS inverter circuits N9 and N10 and an output circuit N11.

Figure 4:
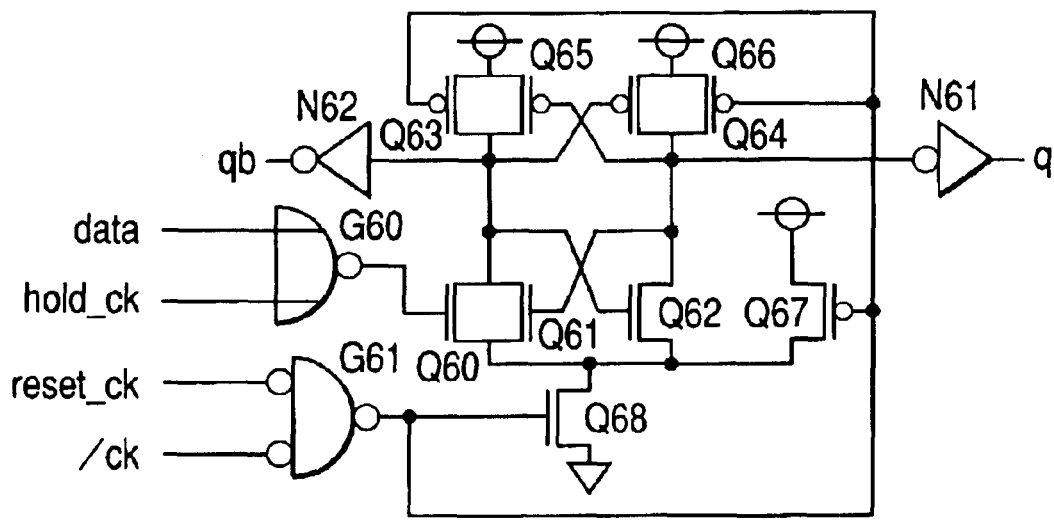
FIG. 4 is a concrete circuit diagram showing an example of an input part in the RAM macro of FIG. 1.

FIG. 4 is a concrete circuit diagram showing an example of the input part of the RAM macro. In the input part of the embodiment, the input circuit and the latch are constructed by a single circuit. In the embodiment, a signal "data" is an input signal which can be also used for an input circuit adapted to not only write data d(71-0) but also the address signals a0 to a9 and signals bs, as, and we(71-0).

The input signal "data", a hold signal hold-ck, a clock signal /ck, and a reset signal reset-ck are input via gate circuits G60 and G61. The input and latch circuit is constructed by P-channel MOSFETs Q65 and Q66 and N-channel MOSFETs Q61 and Q62 in a latch form in which the gates and drains are cross coupled, an input MOSFET Q60 connected to the MOSFET Q61 in parallel, an N-channel MOSFET Q68 for supplying an operation voltage corresponding to the ground potential of the circuit to the MOSFETs Q60 to Q62, and P-channel MOSFETs Q63, Q64, and Q67 for resetting for supplying a power source voltage to commonly connected sources of the MOSFETs Q60 to Q62 and each of intersecting points of the P-channel MOSFETs and N-channel MOSFETs.

The input signal "data" passing through the gate circuit G60 is transmitted to the gate of the N-channel MOSFET Q60. The latch circuit of the embodiment has a proper offset by which, if the MOSFET Q60 is turned off in response to the input signal "data", when the MOSFET Q68 is turned on synchronously with a clock signal /ck, the N-channel MOSFET Q62 as a component of the latch circuit is turned on and the P-channel MOSFET Q65 is stabilized in an on state. By the offset, if the MOSFET Q60 is turned on in response to the input signal "data", when the MOSFET Q68 is turned on synchronously with the clock signal /ck, the N-channel MOSFET Q62 as a component of the latch circuit is turned off and the P-channel MOSFET Q65 is stabilized in the off state.

Figure 5:
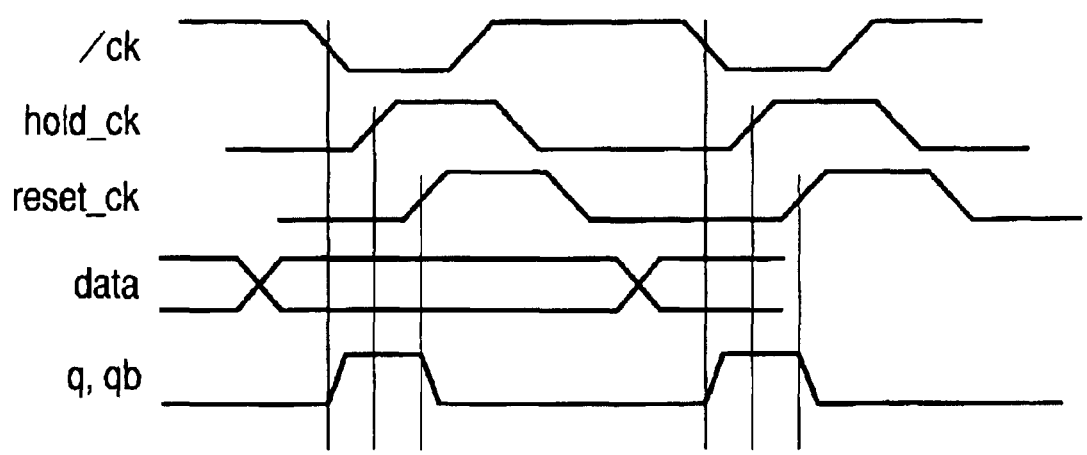
FIG. 5 is a timing chart for explaining an example of operation of an input circuit in FIG. 4.

FIG. 5 is a timing chart for explaining an example of the operation of the input circuit of FIG. 4. Synchronously with the falling edge from the high level to the low level of the clock signal /ck (the rising edge from the low level to the high level of the external clock ck), the P-channel MOSFETs Q63, Q64, and Q67 for resetting are turned off, the N-channel MOSFET Q68 is turned on, and an amplifying operation and a latching operation are performed in correspondence with the on/off state of the MOSFET Q60 in accordance with the input signal "data". The input signal "data" is valid only in the period of the low level of a hold signal "hold", by using a signal hold-ck as an inversion signal (ckb) which is obtained by delaying the clock signal /ck as shown in the clock input circuit CKG in FIG. 2, the input signal "data" is latched only in a predetermined period of the low level of the clock signal /ck. In such a manner, the latch circuit operating synchronously with the edges is realized.

For the amplifying and latching operations, setup time for ascertaining the high or low level prior to the falling edge of the clock signal /ck is provided. By setting a signal reset-ck as an inversion signal (ckp) obtained by delaying the clock signal /ck as shown in the clock input circuit CKG in FIG. 2, the MOSFET Q68 is turned off at the falling edge, so that the input circuit and the latch circuit operate only in a predetermined period necessary for the memory cell selecting operation. The above is similarly applied to a decoder (predecoder) in which a similar circuit is used. Therefore, a word line is selected only for the predetermined time necessary for reading or writing data from/to a memory cell, and a read signal is latched in the latch circuit in the output part. Consequently, there is no problem.

Figure 6:
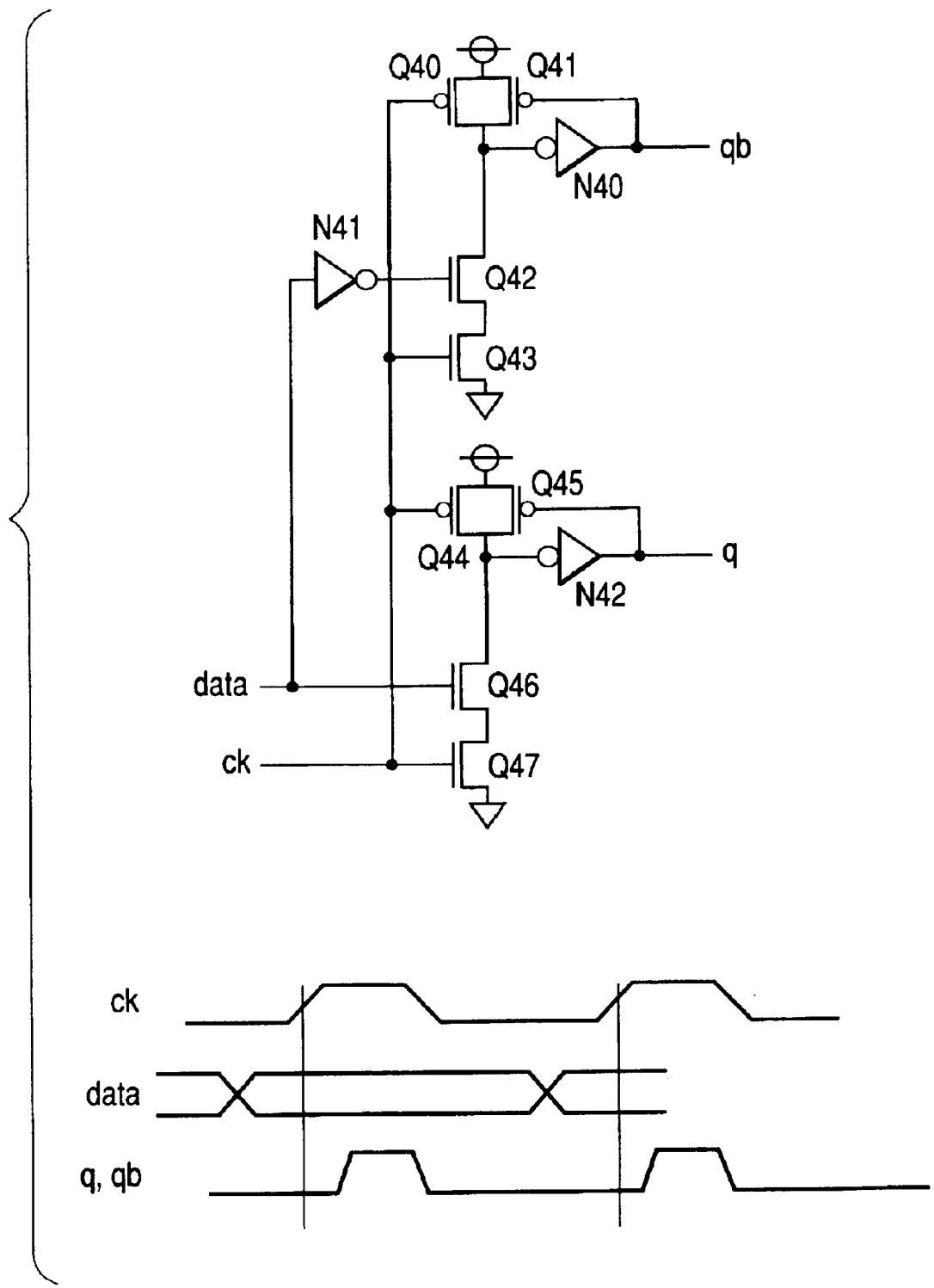
FIG. 6 is a circuit diagram showing another example of an input circuit used for the invention.

FIG. 6 is a circuit diagram showing another example of the input circuit used for the invention. In the embodiment, a so-called domino circuit type address buffer is used. The input signal "data" is supplied to the gate of a MOSFET Q46 as a first input and a P-channel precharge MOSFET Q44 and an N-channel MOSFET Q47 are operated synchronously with the clock signal ck to form an inversion signal of the input signal "data". The inverted input signal "data" obtained through an inverter circuit N41 is supplied to the gate of a MOSFET Q42 as a second input to operate a P-channel precharge MOSFET Q40 and an N-channel MOSFET Q43 synchronously with the clock signal ck, and an inversion signal of the inverted input signal "data" is generated.

When the clock signal ck goes low, the precharge MOSFETs Q40 and Q44 are turned on, outputs q and qb go low, and the circuit is reset in a manner similar to the circuit of the embodiment of FIG. 4. A P-channel MOSFET Q41 and an inverter circuit N40 construct a latch circuit and hold a precharge level in a state where the N-channel MOSFET Q42 is off according to an input signal. Similarly, a P-channel MOSFET Q45 and the inverter circuit N41 construct a latch circuit and hold a precharge level when the N-channel MOSFET Q46 is in the off state according to the input signal. The inverter circuits N40 and N42 also serve as drivers for driving predecoders.

Figure 7:
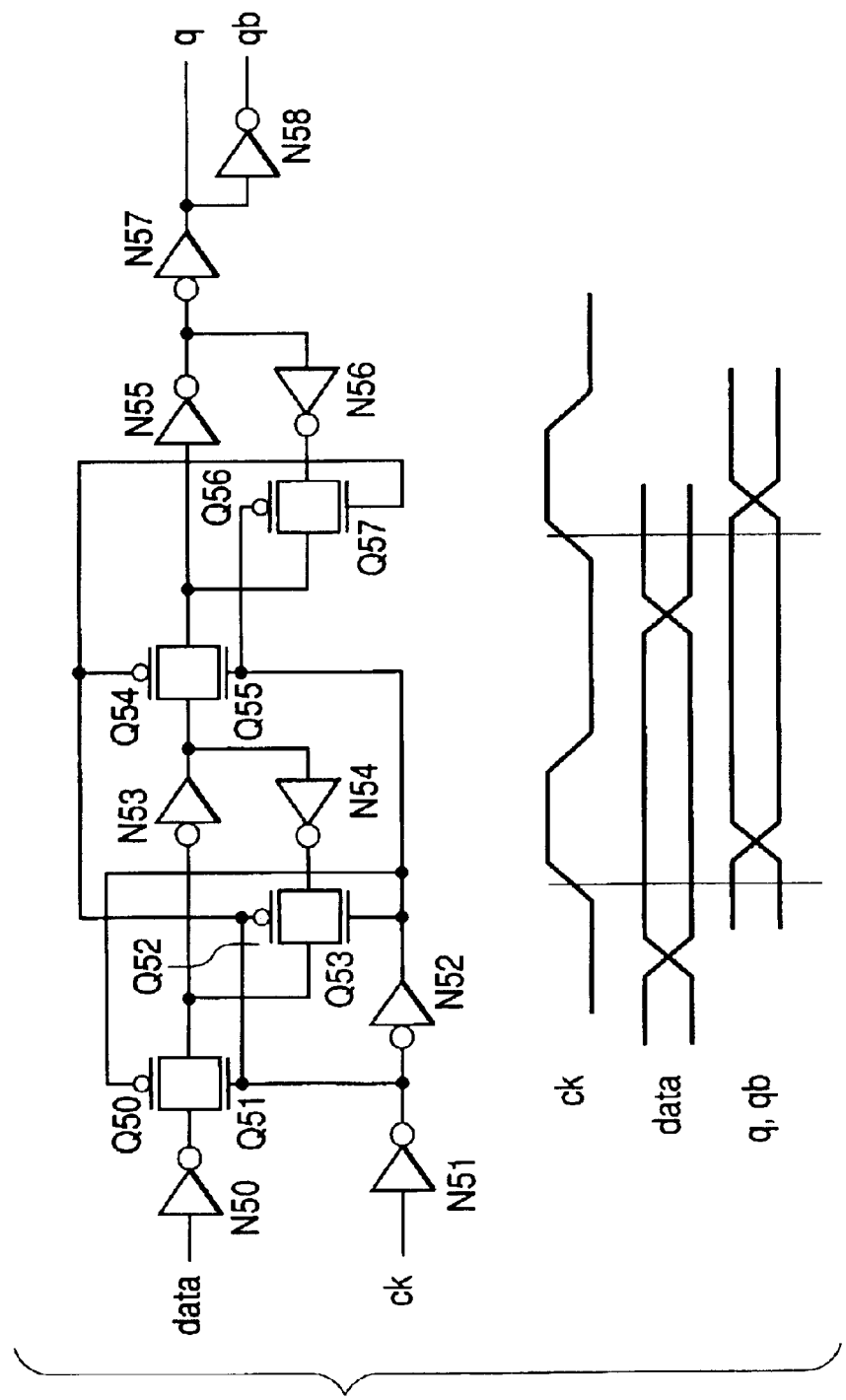
FIG. 7 is a circuit diagram showing further another example of the input circuit used for the invention.

FIG. 7 is a circuit diagram showing further another example of the input circuit used for the invention. In the embodiment, a so-called static flip-flop address is used. By combining a master flip flop and a slave flip flop taking the form of a through latch circuit, an input signal is fetched at the rising edge of the clock ck and latched. In the case of using the input and latch circuits of the configuration, in order to operate the predecoder and subsequent circuits for only time necessary for reading/writing data from/to the memory cell, it is sufficient to supply the clock ck to the predecoder and generate a pulse decode signal.

Figure 8:
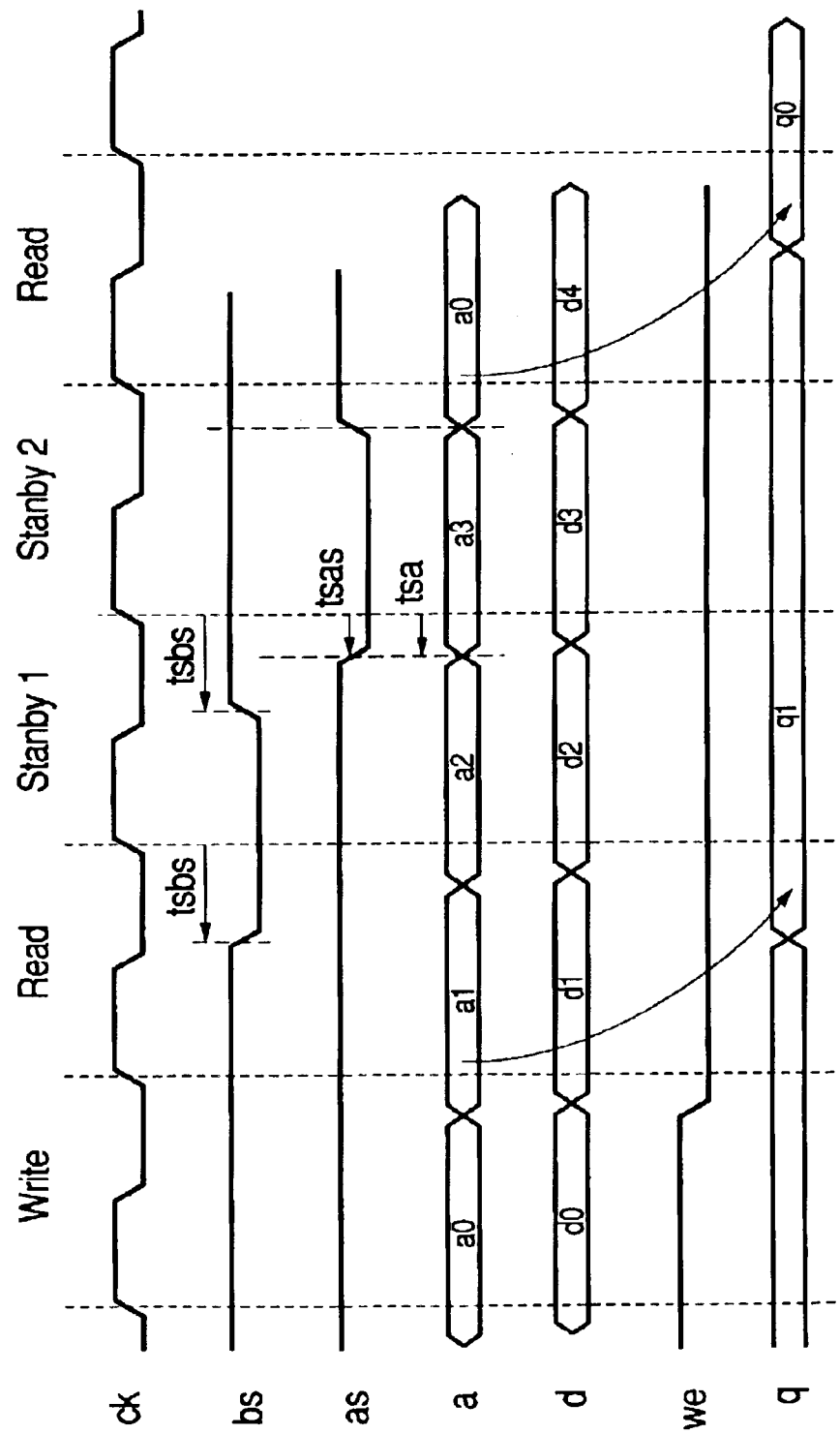
FIG. 8 is a timing chart for explaining an example of operation of the RAM macro of FIG. 1.

FIG. 8 is a timing chart for explaining an example of the operation of the RAM macro. The RAM macro of the embodiment has two kinds of standby modes 1 and 2. In any of the modes, (1) data in a memory cell is held, (2) the RAM macro can reset in a normal operation mode in one cycle, and (3) activation of each RAM macro can be controlled.

Every cycle of the clock signal ck, write and read modes can be set in accordance with the high/low level of the control signal "we" and the standby modes 1 and 2 can be set in accordance with the signals "bs" and "as". For example, in the first cycle of the clock signal ck, the signals "bs" and "as" are at the high level and active, a write cycle is designated in correspondence with the high level of the signal "we", and data d0 is written in the address a0. Subsequently, in the second cycle, the signal "we" goes low and stored in a memory cell in accordance with the address a1, and data q1 is output.

In the third cycle, when the signal bs goes low in advance by setup time tsbs, the standby 1 mode is set. Similarly, in the fourth cycle, the signal "as" is set to the low level in advance with the setup time tsas, thereby setting the standby 2 mode. The setup time tsas is equal to the setup time tas of the address signal.

In the fourth cycle, the signal "as" goes high in advance by the setup time tsas, the address signal a0 is input, a read mode is instructed by the low level of the signal "we", and read data q0 corresponding to the address a0 is output. Until the data q0 is output, the preceding read data q1 is held.

Although the standby mode 1 is switched to the standby mode 2 and, in the following cycle, the read mode is set, the order does not have a special meaning in the present invention. It should be understood that such operation is also possible. The present invention is characterized in that both the case where a memory access is performed from the standby mode 1 and the case where a memory access is performed from the standby mode 2 as described above are possible.

Figure 9:
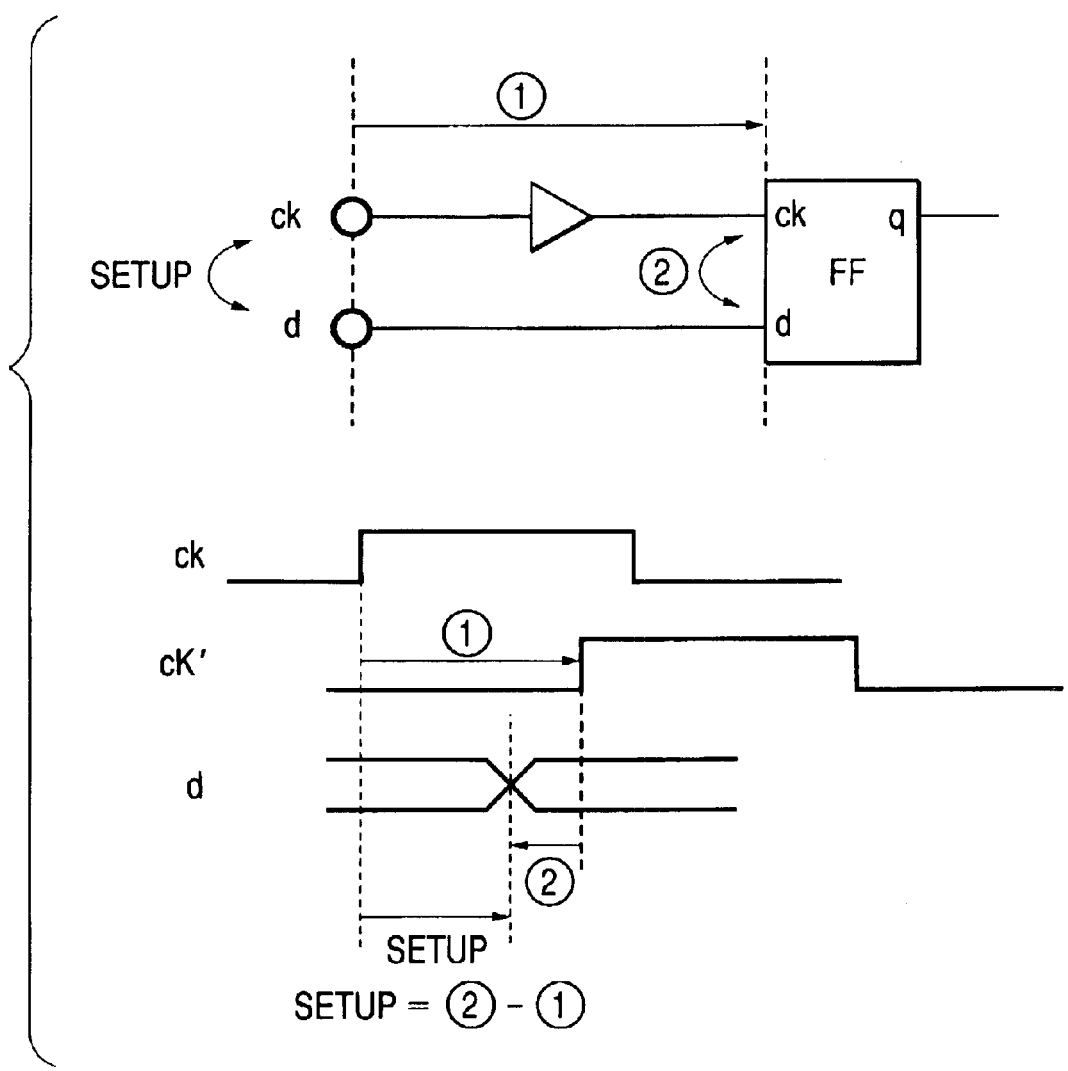
FIG. 9 is a configuration diagram for explaining setup of the RAM macro according to the invention.

FIG. 9 is a configuration diagram for explaining setup of the RAM macro according to the invention. In the embodiment, description will be given on assumption that the RAM macro takes the form of a flip flop FF. It is assumed that, in the flip flop FF, the clock ck is input to a clock terminal ck of the flip flop FF with delay time (1) in a transmission path and data "d" is transmitted to a data terminal "d" of the flip flop FF without delay. Setup time "setup" corresponding to the time difference (2) between a clock signal ck' which is transmitted to the clock terminal ck and the data "d". That is, when the clock signal is transmitted to the clock terminal ck in the flip flop FF, the setup time "setup" corresponds to time required to input the data "d" to be latched synchronously with the clock signal and expresses that data has to be advanced only by the setup time (2) from a clock.

As shown in the diagram, in the case where delay is provided in the transmission path of the clock signal ck, the clock signal ck' to be transmitted to the clock terminal ck of the flip flop FF is a signal delayed only by delay time (1). In this case, as shown in a black box including also the delay time (1) of the transmission path, the substantial setup time "setup" between the clock signal ck and the data "d" can be set, not as plus time such that the data precedes as shown by (2) of the flip flop FF, but minus time that the data "d" is behind the clock signal ck.

In consideration of the above, setup in the RAM macro according to the invention will be described. In the case of accessing the RAM macro from the standby mode 1, as shown in FIG. 1 or 2, the signal bs is received synchronously with the clock signal ck. By the received signal bs, the gate circuit is controlled to supply the clock signal ck to the address input circuit or the like. Therefore, in order to start a memory access from the standby mode 1, the signal bs has to be set to the high level prior to the clock signal ck only by the setup time tsbs.

In contrast, the other input signals such as the address signals a0 to a9 may be behind the signal bs in reality since the clock signal is transmitted delayed to the input circuit for receiving the input signals. When seen from a signal generation source such as a processor for accessing the RAM macro, the addresses a0 to a9, signal "as", and data d(71-0) other than the signal bs are output simultaneously at the same timing. Consequently, the setup time in the case of accessing a memory from the standby mode 1 is determined by the critical signal bs. In this case, no delay occurs in the clock signal ck, so that the time (1) in FIG. 9 becomes zero and the setup time of (2) is, for example, 160 psec.

In the case of accessing the RAM macro from the standby mode 2, as shown in FIG. 1 or 2, the clock signal ck is delayed via the gate circuit, and the address signals a0 to a9, signal "as" and data d(71-0) are fetched and transmitted to the input circuit. Therefore, the setup time in the case of accessing a memory from the standby mode 2 is determined by the signal "as" and the address signal "a". In this case, a delay caused by the gate circuit G01 or the like occurs in the clock signal ck, so that the time (1) shown in FIG. 9 is not zero but delay time of, for example, about 170 psec occurs and the setup time can be reduced as −10 psec (=160−170).

When the setup time is short, particularly, when the setup time is minus, the address signal "a" and the data "d" can be generated behind the clock signal ck. When seen from the memory control circuit such as a processor for accessing the RAM macro, there is an advantage such that generation of the memory access signal is facilitated.

From the above, in the standby mode 1 of setting the signal bs to the low level, a power reduction effect of about −99% can be produced. On the other hand, when a memory access is started from the standby mode 1, the setup value becomes large like 160 psec, so that response deteriorates.

In the standby mode 2 in which the signal bs is set to the high level and the signal "as" is set to the low level, the power reduction effect of about −90% which is lower than that of the standby mode 1 is produced. On the other hand, at the time of starting a memory access from the standby mode 2, the setup value becomes small as, for example, −10 psec, so that response is improved.

By providing the two kinds of standby modes 1 and 2, optimization according to a use of the RAM macro, that is, a use in which priority is placed on low power consumption in the standby mode and a use in which priority is placed on response can be performed. There is also an advantage such that a single RAM macro can be optimized according to an operation mode of accessing the RAM macro and used.

Figure 10:
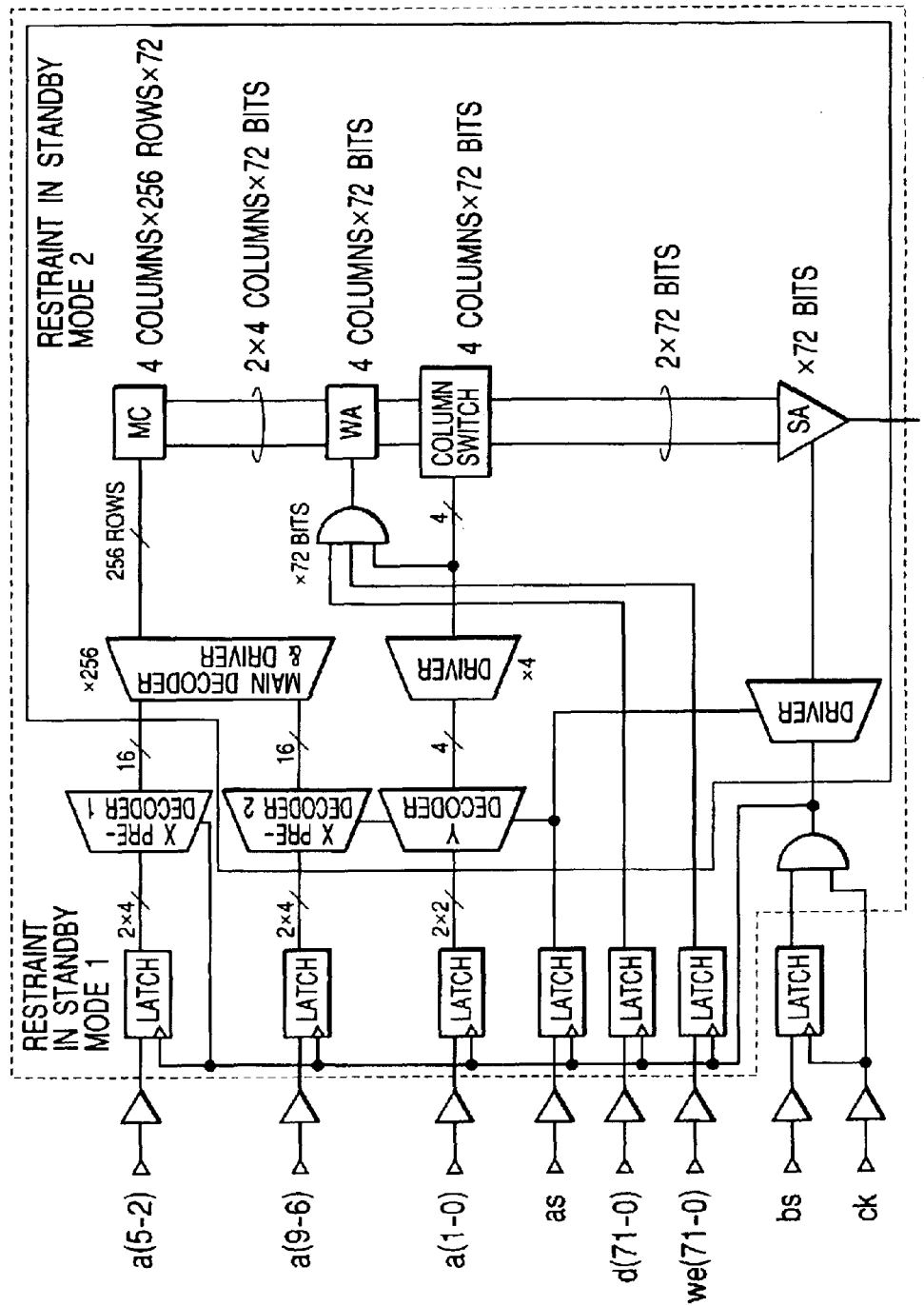
FIG. 10 is a block diagram showing another example of the RAM macro mounted on the semiconductor integrated circuit device according to the invention.

FIG. 10 is a block diagram showing another example of the RAM macro mounted on the semiconductor integrated circuit device according to the invention. The embodiment is a modification of the embodiment of FIG. 1. In FIG. 1, the X predecoder 1 is restrained in the standby mode 2. In the modification, the X predecoder 1 is restrained in the standby mode 1 for the following reason. When the restraint is performed in the standby mode 2, the circuit scale of the circuit in which the signal "as" is controlled becomes large like the driver for activating the X predecoders 1 and 2, the Y decoder, and the sense amplifier in FIG. 1 and the load, that is, the number of fan-outs is large.

In the embodiment, the X predecoder 1 is operated by the clock signal supplied through the gate circuit controlled by the signal bs, thereby lessening the load of the signal "as". In this case, in the standby mode 2, although the X predecoder 1 also operates and outputs a predecode signal, the main decoder does not operate, so that operation of selecting a memory array is not performed. With respect to the memory selecting operation, the standby mode 2 similar to that in the embodiment of FIG. 1 can be realized.

Figure 11:
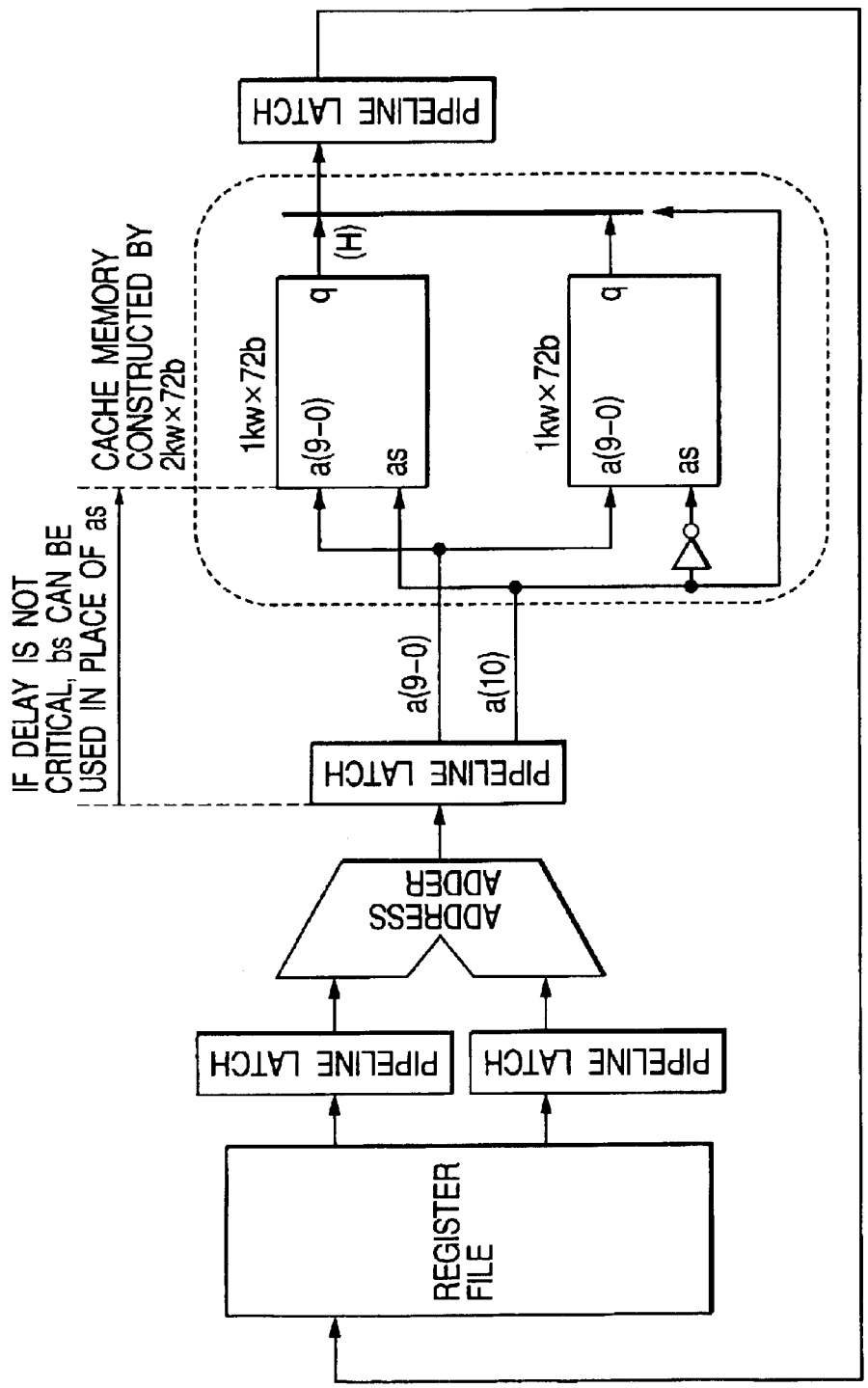
FIG. 11 is a block diagram showing an example of a memory circuit using a RAM macro mounted on the semiconductor integrated circuit device according to the invention.

FIG. 11 is a block diagram showing an example of a memory circuit using the RAM macro mounted on the semiconductor integrated circuit device according to the invention. In the embodiment, a cache memory of which storage capacity is doubled by combining two RAM macros is constructed. For example, in a register file, two pieces of data are computed by an address adder via pipeline latches to generate an address signal and the address signal is transmitted to a pipeline latch. The address signal is supplied in such a manner that address signals a(9-0) are commonly supplied to the two RAM macros and the address signal a(10) of the most significant bit is assigned as the signal "as" and supplied. That is, the address signal a(10) is supplied as it is as one of the RAM macro signals "as" and the address signal a(10) inverted by an inverter is supplied as the other RAM macro signal "as".

One of the RAM macros becomes active according to the signal "as" and the other RAM macro enters the standby mode 2. In the standby mode 2, as described above, the sense amplifier SA is not activated and an output has high impedance (H). Consequently, an output signal from the RAM macro in the active state is transmitted to a pipeline latch. In the case where latch circuits N9 and N10 and the output circuit N11 are provided in each of the RAM macros as in the embodiment of FIG. 3, a wired OR logic using a tri-state output circuit of two RAM macros is not employed. It is sufficient to set one of the output circuits N11 to an output high impedance state in accordance with the high or low level of the signal a(10)

In other words, for the RAM macro, it is sufficient to mount only an output circuit of the sense amplifier SA and provide a latch circuit constructed by the inverter circuits N9 and N10 shown in FIG. 3 and the output circuit N11 in the input part of the pipeline latch. In the embodiment, by using the signal "as", the setup time can be reduced. Consequently, the computation time can be assured by an address adder or the like. By using the storage capacity of one RAM macro as a minimum unit, the storing capacity of the RAM macros can be variously set by combining a plurality of RAM macros. Consequently, the number of design steps can be reduced. In the case where high response is not required so much, that is, delay is not critical, the signal bs can be also used in place of the signal "as".

Figure 12:
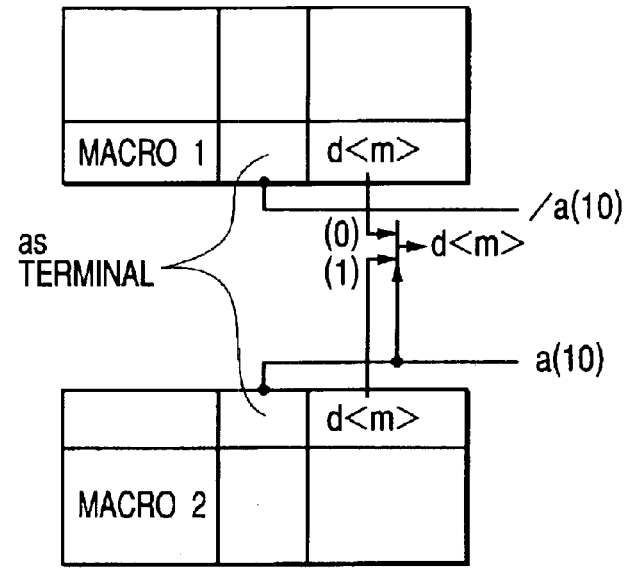
FIG. 12 is a configuration diagram for explaining a method of expanding the RAM macro according to the invention.
Figure 12:
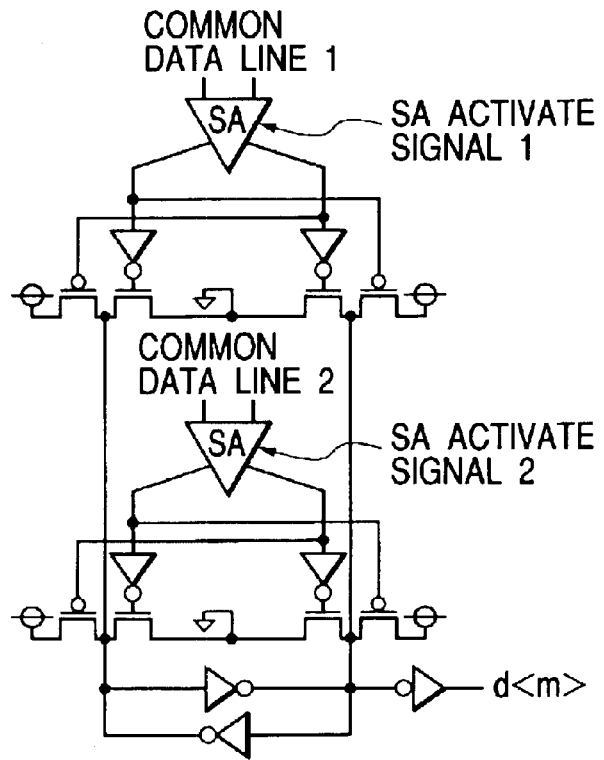

FIG. 12 is a configuration diagram for explaining a method of expanding the RAM macro according to the invention. In the case of combining two semiconductor integrated circuit devices in each of which a plurality of RAM macros are mounted as shown in FIG. 1 or 2, specifically, expansion (A) of storage capacity by the user is realized by assigning the address signals /a(10) and a(10) to the terminal "as", supplying the signals to inputs (0) and (1) of a multiplexer, selecting either the input (0) or (1) of the multiplexer by the address signal a (10), and obtaining an output signal dm. The embodiment of FIG. 11 corresponds to the example (A). In the case of expanding the storage capacity by a RAM design engineer (B), it is sufficient to simply form wired OR connection in the output circuit of the sense amplifier SA and provide the latch circuit and the output circuit as described above.

Figure 13:
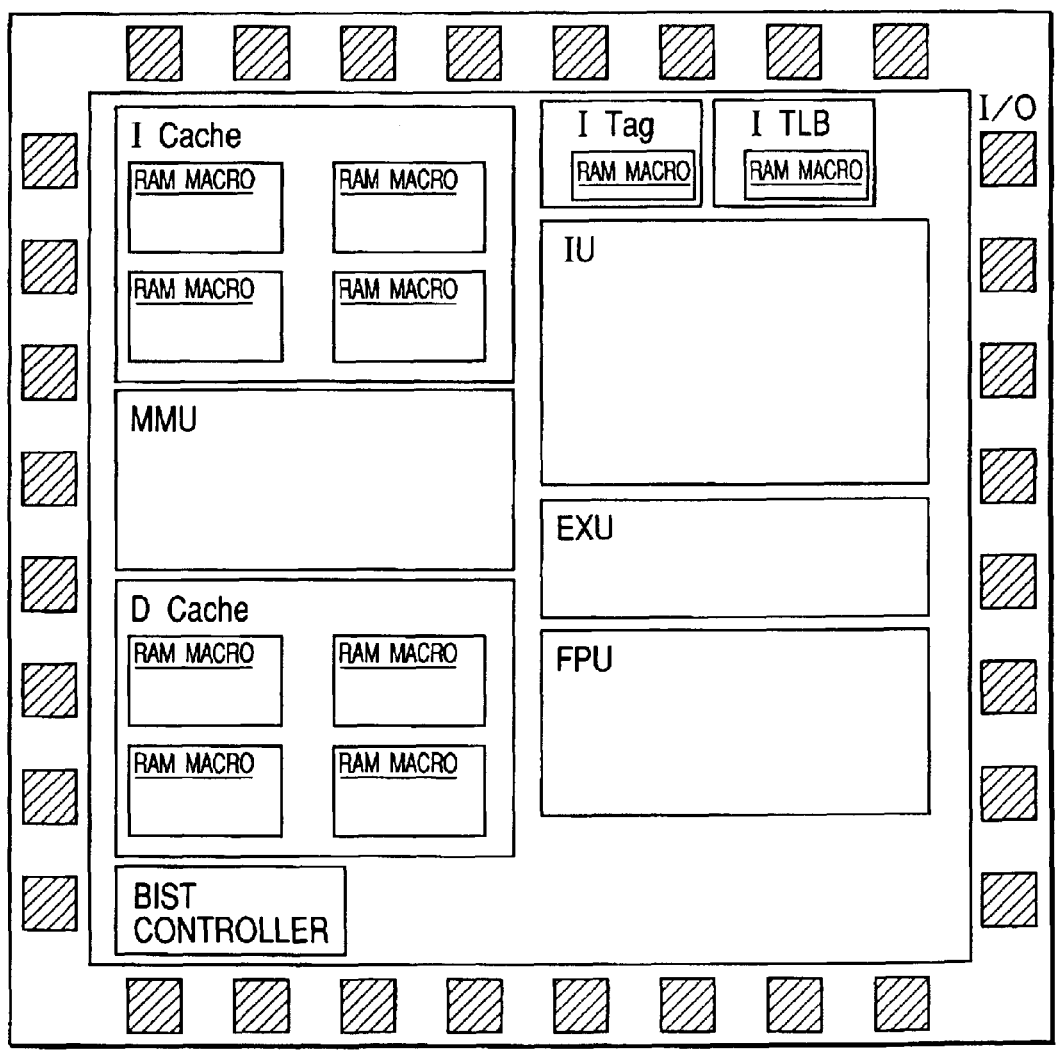
FIG. 13 is a general configuration diagram showing an example of the semiconductor integrated circuit device according to the invention.

FIG. 13 is a general configuration diagram of an embodiment of the semiconductor integrated circuit device according to the invention. Circuit blocks in FIG. 13 are shown in accordance with geometrical arrangement on an actual semiconductor chip.

The embodiment is directed to a 1-chip microprocessor including an instruction cache (I cache) an instruction translation look-aside buffer (I TLB), an instruction tag (I tag), a data cache (D cache), a data translation look-aside buffer (D TLB), a data tag (D tag), a memory management unit (MMU), an instruction unit (IU), an execution unit (EXU), a floating point unit (FPU), and a test circuit (BIST controller).

In each of the circuit blocks, a plurality of RAM macros provided in correspondence with each function are included. Memory access time exerts a large influence on operation speed in each of the circuit blocks. In the embodiment, the two kinds of standby modes 1 and 2 are provided and optimization corresponding to the roles and the operation modes can be realized. While maintaining the operations, the storage capacity can be flexibly set by combining a plurality of RAM macros. Thus, the RAM macros can be optimized and the number of design steps can be reduced.

Although the invention achieved by the inventor herein has been described above, the invention is not limited to the foregoing embodiments but can be variously changed without departing from the gist. For example, the invention is not limited to the RAM macro which operates synchronously with clock signals. Any RAM macro can be used as long as it operates in two kinds of standby modes which are set by combination of two signals such as the signals "bs" and "as", that is, a circuit block of which operation is stopped can be determined in accordance with the operation sequence. Although the invention achieved by the inventor herein has been described with respect to the case where it is applied to an LSI such as a microprocessor having therein a plurality of RAM macros in a field of utilization as the background of the invention, the invention is not limited to the case. A RAM itself may be a semiconductor integrated circuit device. Any RAM macro can be employed as long as it generates a predetermined output signal in response to another input signal to the RAM.

Effects obtained by representative ones of the inventions disclosed in the specification will be briefly described as follows. In the RAM macro, by providing the first operation mode in which a timing of receiving write data for a memory cell selection starting timing is set as a first timing and the second operation mode in which a timing of receiving write data for the memory cell selection starting timing is set as a second timing later than the first timing, the setup time can be set in two ways and optimization in a system or an operation mode can be realized.

The outline of another representative one of inventions disclosed in the specification will be briefly described as follows. In a semiconductor integrated circuit device including an input circuit for receiving an input signal and a decoder circuit for decoding an output signal of the input circuit, the input circuit is activated on the basis of a first signal and the decoder circuit is activated on the basis of a second signal. With the configuration, two kinds of standby modes can be set and optimization in a system or an operation mode and expansion of a storage capacity off a RAM macro can be easily performed.

What is claimed is:

1. A semiconductor integrated circuit device, comprising:
   a RAM macro having an input circuit for receiving an input signal and a decoder circuit for decoding an output signal of said input circuit, said input circuit being activated on the basis of a first signal and said decoder circuit being activated on the basis of a second signal; and
   a clock input terminal and a gate circuit,
   wherein said first signal is a signal which is received synchronously with a clock signal supplied from said clock input terminal and controls said gate circuit,
   wherein said gate circuit uses a signal supplied from said clock input terminal as a signal for activating said input circuit, and
   wherein said RAM macro has a first operation mode in which a timing of receiving the input signal is set to a first timing and a second operation mode in which a timing of receiving the input signal is set to a second timing later than said first timing.

2. The semiconductor integrated circuit device according to claim 1, wherein said input circuit includes a circuit for receiving said second signal.

3. A semiconductor integrated circuit device, comprising:
   an input circuit for receiving an input signal;
   a decoder circuit for decoding an output signal of said input circuit;
   a circuit for activating said input circuit on the basis of a first signal and activating said decoder circuit on the basis of a second signal; and a clock input terminal and a gate circuit,
   wherein said first signal is a signal which is received synchronously with a clock signal supplied from said clock input terminal and controls said gate circuit, and
   said gate circuit uses a signal supplied from said clock input terminal as a signal for activating said input circuit.

4. The semiconductor integrated circuit device according to claim 3,
   wherein said decoder circuit generates a memory cell selecting signal, and
   wherein said second signal is used also as a signal for activating an output circuit for outputting a read signal from a memory cell.

5. The semiconductor integrated circuit device according to claim 4,
   wherein said decoder circuit includes first and second predecoders and a main decoder circuit for receiving output signals of said first and second predecoder circuits and generating a word line selecting signal,
   wherein said first predecoder is activated on the basis of said first signal, and
   wherein said second predecoder and the main decoder circuit are activated on the basis of said second signal.

6. The semiconductor integrated circuit device according to claim 4, wherein said input circuit or decoder circuit outputs an output signal which is valid for a first period since said clock signal is set to an active level, and said first period is a period necessary for writing/reading data to/from a memory cell.

7. The semiconductor integrated circuit device according to claim 4, wherein said circuit is a RAM macro and is one of a plurality of circuit blocks.

8. The semiconductor integrated circuit device according to claim 5, wherein a plurality of RAM macros are provided, and outputs of output circuits of said RAM macros are connected to a common output node.

9. A semiconductor device, comprising:
   a plurality of memory cells;
   an address input buffer for receiving a plurality of address signals for selecting said plurality of memory cells;
   a first circuit for setting an output of said address input buffer to a first predetermined potential in a first standby mode;
   an address decoder for receiving an output signal of said address input buffer; and
   a second circuit for setting an output signal of said address decoder to a second predetermined potential in a second standby mode,
   wherein said address input buffer is made inactive in said first standby mode, and
   wherein said address input buffer is made active in said second standby mode.

10. The semiconductor device according to claim 9, wherein an operation voltage of said address decoder is supplied to said address decoder in said first and second standby modes.

11. The semiconductor device according to claim 9, wherein said address decoder is made operative in said first and second standby modes.

12. The semiconductor device according to claim 9, wherein said first and second standby modes are set by two control signals.

13. The semiconductor device according to claim 9, wherein in said first standby mode, a current path in said address input buffer is interrupted, thereby making said address input buffer inactive.

14. The semiconductor device according to claim 9, wherein operation of reading information stored in said plurality of memory cells or operation of writing information into said plurality of memory cells is not performed in said first and second standby modes.

* * * * *